(12) United States Patent
Han

(10) Patent No.: US 7,542,336 B2
(45) Date of Patent: Jun. 2, 2009

(54) ARCHITECTURE AND METHOD FOR NAND FLASH MEMORY

(75) Inventor: Jin-Man Han, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/107,315

(22) Filed: Apr. 22, 2008

(65) Prior Publication Data

US 2008/0192538 A1 Aug. 14, 2008

Related U.S. Application Data

(62) Division of application No. 11/452,697, filed on Jun. 14, 2006, now Pat. No. 7,372,715.

(51) Int. Cl.
*G11C 16/04* (2006.01)
(52) U.S. Cl. .............................. 365/185.02; 365/185.17
(58) Field of Classification Search ............ 365/185.02, 365/185.17, 185.11, 185.12
See application file for complete search history.

(56) References Cited

U.S. PATENT DOCUMENTS

| 5,883,826 | A | 3/1999 | Wendell et al. | |
|---|---|---|---|---|
| 6,052,323 | A | 4/2000 | Kawamura | |
| 6,522,580 | B2* | 2/2003 | Chen et al. | 365/185.02 |
| 6,631,089 | B1 | 10/2003 | Ogura et al. | |
| 6,721,221 | B2 | 4/2004 | Schreck | |
| 6,810,512 | B2 | 10/2004 | Roohparvar | |
| 6,876,567 | B2 | 4/2005 | Chow | |
| 6,927,990 | B2 | 8/2005 | Mukai | |
| 7,061,802 | B2* | 6/2006 | Nakai | 365/185.13 |
| 7,408,806 | B2* | 8/2008 | Park et al. | 365/185.17 |
| 2005/0045918 | A1 | 3/2005 | Reith | |
| 2007/0279989 | A1* | 12/2007 | Aritome | 365/185.18 |

* cited by examiner

*Primary Examiner*—Vu A Le
(74) *Attorney, Agent, or Firm*—Leffert Jay & Polglaze, P.A.

(57) ABSTRACT

A NAND memory architecture arranges all even bitlines of a page together, and arranges all odd bitlines of a page together, so that programming operations are carried out on adjacent bitlines on the same word line to reduce floating gate coupling. Non-connected bitlines can be used at boundaries between even and odd sections of the array to further reduce floating gate coupling.

18 Claims, 5 Drawing Sheets

ARCHITECTURE AND METHOD FOR NAND FLASH MEMORY

RELATED APPLICATION

This application is a divisional of U.S. application Ser. No. 11/452,697, titled "ARCHITECTURE AND METHOD FOR NAND FLASH MEMORY," filed Jun. 14, 2006, now U.S. Pat. No. 7,372,715 which is commonly assigned and incorporated herein by reference.

FIELD

The present invention relates generally to semiconductor memories and in particular the present invention relates to flash memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Conventional NAND memory architecture has even and odd rows adjacent to each other so that no adjacent word line is being programmed at the same time. Conventional read operations have a page read for even pages and a page read for odd pages. Not every cell can be read at the same time.

In NAND memories, coupling between the floating gates of cells, especially those on the same physical word lines of the memory, can be a problem. The problem continues to increase as the distance between floating gates decreases with decreasing memory sizes. As NAND flash memory is scaled, parasitic capacitance coupling between adjacent memory cell floating gates becomes a problem. Because of the capacitive coupling, the cells that are adjacent to a cell storing a charge are prone to having their threshold voltages ($V_t$) raised. If the adjacent cells have their threshold voltages raised too high, an unprogrammed cell might appear as being programmed. The increased capacitive coupling between the floating gates can affect the verification, reading, and erasing of adjacent cells.

For the reasons stated above, and for other reasons stated below which will become apparent to those skilled in the art upon reading and understanding the present specification, there is a need in the art for reduction of floating gate coupling in NAND memories.

DETAILED DESCRIPTION

Figure 1:
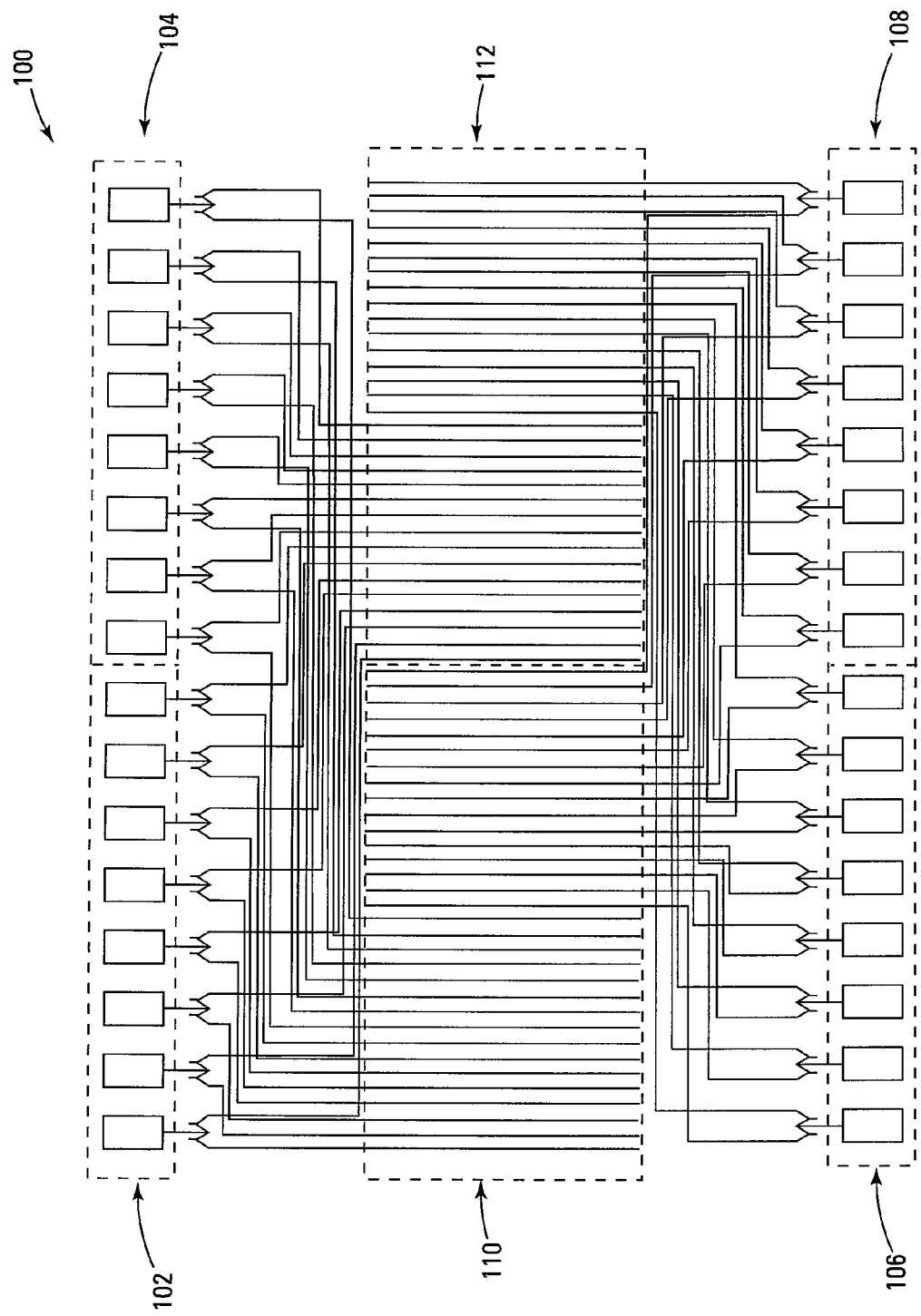
FIG. 1 is a circuit diagram of a portion of a memory array according to one embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

A sense amplifier architecture according to the embodiments of the present invention reduces bitline to bitline floating gate coupling between adjacent NAND cells on the same word lines and allows simultaneous program operations on the adjacent NAND cells on the same word line. Since adjacent cells are being programmed, where typical NAND memories do not program adjacent cells, the problems with floating gate coupling are significantly reduced as both cells are at a programming potential. To accomplish this, in one embodiment the bitlines are arranged in the array so that all of the even bitlines are in one portion of the array, and all of the odd bitlines are in a second portion of the array, as shown in FIG. 1.

In FIG. 1, a NAND flash architecture and layout is shown. The same architecture is shown in block diagram format in FIG. 2. In this embodiment, a page comprises 64 bitlines connected to 32 sense amplifiers. The sense amplifiers are identified in four blocks, 102, 104, 106, and 108. Each sense amplifier is connected to two bitlines, an even bitline and an odd bitline. For sense amplifier blocks 102 and 104, the even bitlines for each sense amplifier are routed to area 110, and the odd bitlines are routed to area 112. For sense amplifier blocks 106 and 108, the even bitlines for each sense amplifier are routed to area 110, and the odd bitlines are routed to area 112.

In this embodiment, there is one transition boundary per 64 bitlines where a bitline is adjacent to a bitline that is not the same odd or even as its adjacent bitline, at the boundary between areas 110 and 112. This transition has a potential for floating gate coupling between a bitline that is being programmed and a bitline that is being inhibited. In the remaining areas of the page, all adjacent flash cells are being programmed simultaneously, thereby reducing bitline to bitline floating gate coupling on the same word line.

Figure 3:
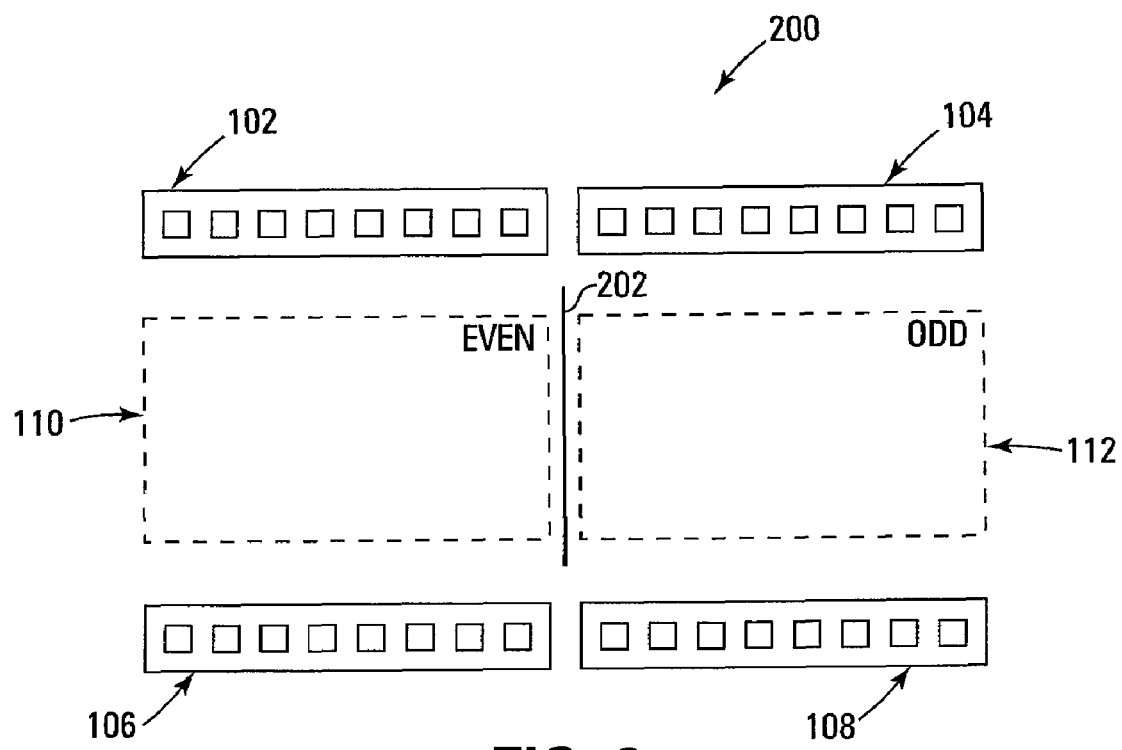
FIG. 3 is a block diagram of a portion of a memory array according to yet another embodiment of ther present invention.

In another embodiment 200 shown in FIG. 3, a dummy, or non-connected, bitline 202 is positioned between the areas 110 and 112 to reduce floating gate coupling. This dummy bitline 202 adds less than two percent of overhead to the array.

In yet another embodiment, the potential floating gate coupling on the odd/even boundary between areas 110 and 112 is reduced by using increased isolation. In another embodiment, an isolation scheme is used between the areas 110 and 112 to reduce floating gate coupling. Various isolation schemes include using an isolation trench, an increased gap between the boundary bitlines, and the like.

While the sense amplifier trace routes in the present embodiments are longer than in conventional architectures, they provide substantial reduction in floating gate coupling, which has become a large problem in NAND flash applications. They further allow the programming of adjacent bitlines on the same word line with reduced floating gate coupling.

The present invention embodiments share a sense amplifier such that cells all connect to the sense amplifiers. Conventional programming programmed every other physically arranged bitline. With the present embodiments, a half a page can be programmed at the same time, and that half page includes adjacent bitlines on the same word line. The number of cells programmed per word line remains the same, because the size of the sense amplifiers does not significantly change. However, the sense amplifier connections are rearranged so that all the cells in a particular area get programmed at the same time. In one embodiment, there are two areas for each page, with all the even bitlines in one area and all the odd bitlines in the other area. In one embodiment, a page comprises 64 bitlines on 32 sense amplifiers, although other configurations with different numbers of sense amplifiers and/or bitlines are amenable to use with the various embodiments of the present invention, and are within its scope.

Figure 2:
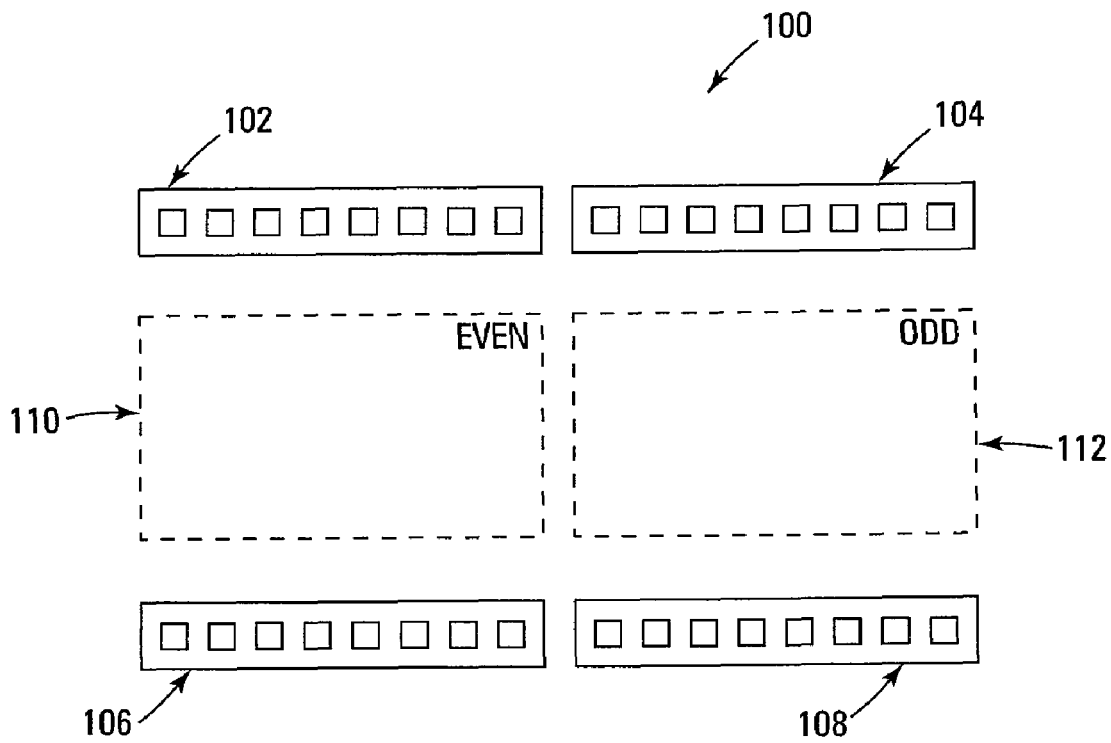
FIG. 2 is a block diagram of a portion of a memory array according to another embodiment of the present invention.
Figure 4:
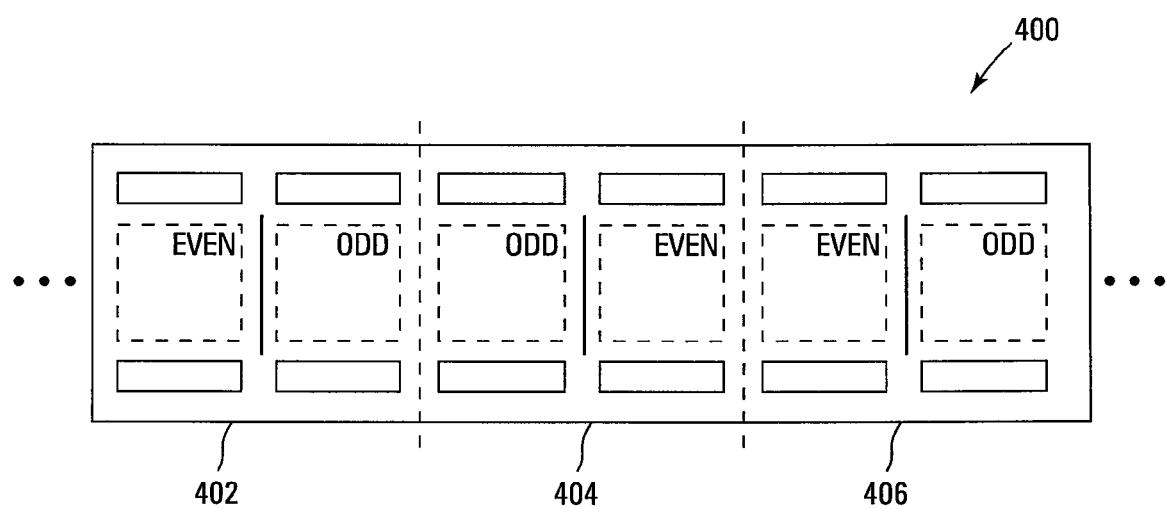
FIG. 4 is a block diagram of an array configuration according to another embodiment of the present invention.

In another embodiment, multiple pages of cells are arranged as shown in embodiment 400 of FIG. 4 to keep the number of odd/even boundaries small. For example, as is shown in FIG. 4, adjacent pages 402, 404, and 406 have their odd bitlines arranged together and their even bitlines arranged together, even across page boundaries. Therefore, a single non-connected bitline, if it is used, is sufficient for each 64 bitlines of the memory. If pages are configured so that they are all the same, that is have the same order of even/odd bitlines arranged as is shown in FIGS. 1 and 2, then additional non-connected bitlines, if they are used, can be used to reduce floating gate coupling.

Figure 5:
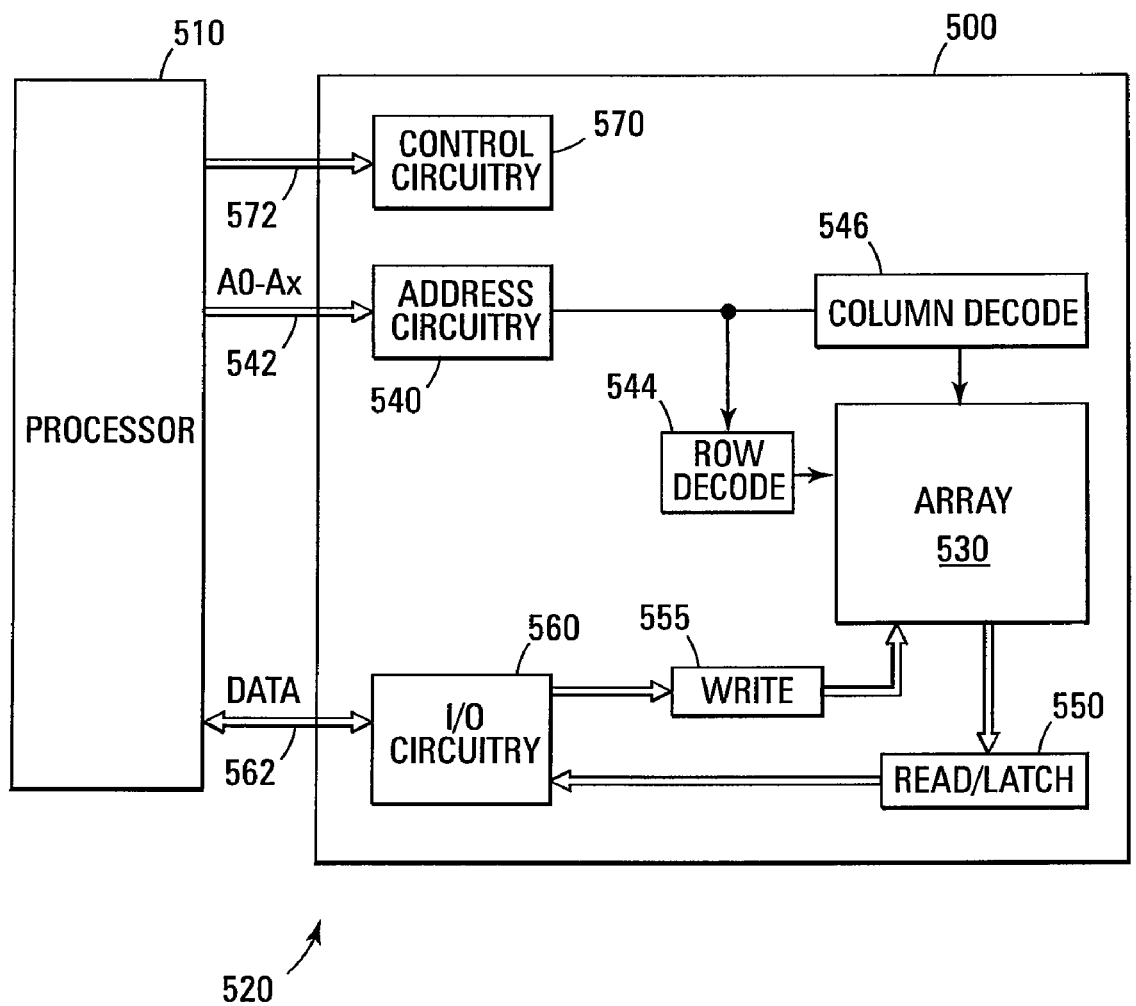
FIG. 5 is a functional block diagram of an electrical system having at least one memory device with a memory array configuration according to one embodiment of the present invention.

FIG. 5 is a functional block diagram of a memory device 500, such as a flash memory device, of one embodiment of the present invention, which is coupled to a processor 510. The memory device 500 and the processor 510 may form part of an electronic system 520. The memory device 500 has been simplified to focus on features of the memory that are helpful in understanding the present invention. The memory device includes an array of memory cells 530 having even/odd bitline configurations such as those shown in FIGS. 1, 2, 3, or 4 and described above. The memory array 530 is arranged in banks of rows and columns.

An address buffer circuit 540 is provided to latch address signals provided on address input connections A0-Ax 542. Address signals are received and decoded by row decoder 544 and a column decoder 546 to access the memory array 530. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 530 by sensing voltage or current changes in the memory array columns using sense/latch circuitry 550. The sense/latch circuitry, in one embodiment, is coupled to read and latch a row of data from the memory array. Data input and output buffer circuitry 560 is included for bidirectional data communication over a plurality of data (DQ) connections 562 with the processor 510, and is connected to write circuitry 555 and read/latch circuitry 550 for performing read and write operations on the memory 500.

Command control circuit 570 decodes signals provided on control connections 572 from the processor 510. These signals are used to control the operations on the memory array 530, including data read, data write, and erase operations. The flash memory device has been simplified to facilitate a basic understanding of the features of the memory. A more detailed understanding of internal circuitry and functions of flash memories are known to those skilled in the art.

Figure 6:
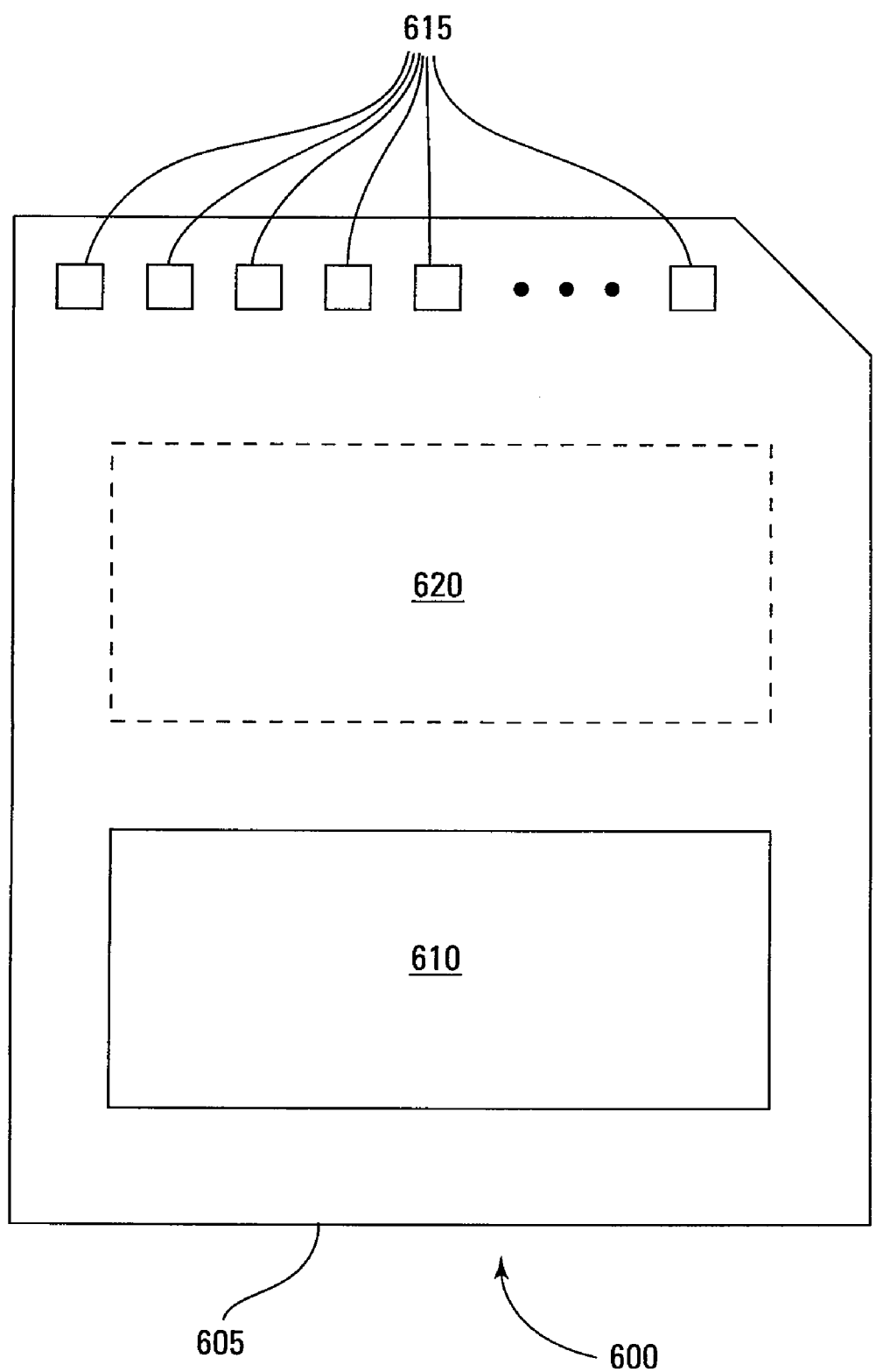
FIG. 6 is a functional block diagram of a memory module having at least one memory device in accordance with an embodiment of the invention.

FIG. 6 is an illustration of an exemplary memory module 600. Memory module 600 is illustrated as a memory card, although the concepts discussed with reference to memory module 600 are applicable to other types of removable or portable memory, e.g., USB flash drives, and are intended to be within the scope of "memory module" as used herein. In addition, although one example form factor is depicted in FIG. 6, these concepts are applicable to other form factors as well.

In some embodiments, memory module 600 will include a housing 605 (as depicted) to enclose one or more memory devices 610, though such a housing is not essential to all devices or device applications. At least one memory device 610 is a non-volatile memory including a bitline configuration according to various embodiments of the present invention. Where present, the housing 605 includes one or more contacts 615 for communication with a host device. Examples of host devices include digital cameras, digital recording and playback devices, PDAs, personal computers, memory card readers, interface hubs and the like. For some embodiments, the contacts 615 are in the form of a standardized interface. For example, with a USB flash drive, the contacts 615 might be in the form of a USB Type-A male connector. For some embodiments, the contacts 615 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 615 provide an interface for passing control, address and/or data signals between the memory module 600 and a host having compatible receptors for the contacts 615.

The memory module 600 may optionally include additional circuitry 620 which may be one or more integrated circuits and/or discrete components. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC (application specific integrated circuit). Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

A bitline and sense amplifier NAND configuration and method for programming has been described that includes arranging bitlines so that bitlines physically adjacent to one another are programmed in a block, reducing the floating gate coupling between bitlines on the same word line. Non-connected bitlines can be used to further reduce floating gate coupling at boundaries between array areas of even and odd bitlines.

To program cells adjacent to each other in a NAND array, the bitlines are arranged so that physically, the even bitlines are all adjacent each other, and the odd bitlines are all physically adjacent each other in a different area of the array. All even or all odd bitlines are programmed simultaneously. Non-connected bitlines can be used to further reduce floating gate coupling at boundaries where odd and even bitlines are adjacent each other. In some embodiments, the frequency of a non-connected bitline is one per 64 bitlines.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of programming a NAND array, comprising:
   simultaneously programming a first plurality of cells, each cell adjacent to another of the first plurality of cells being programmed;
   simultaneously programming a second plurality of cells, each cell adjacent to another of the second plurality of cells being programmed; and isolating the first plurality of cells from the second plurality of cells.

2. The method of claim 1, wherein isolating further comprises placing an isolation trench between the first plurality of cells and the second plurality of cells.

3. The method of claim 1, wherein isolating further comprises placing a non-connected bitline between the first plurality of cells and the second plurality of cells.

4. A method of programming a NAND array, comprising:
   arranging bitlines in the array so that all of the even bitlines are in a first array area and all of the odd bitlines are in a second array area;
   programming all the even bitlines of the array simultaneously;
   programming all the odd bitlines of the array simultaneously; and
   reducing floating gate coupling at a boundary between the first array area and the second array area.

5. The method of claim 4, wherein reducing floating gate coupling comprises:
   providing a non-connected bitline at the boundary between the first array area and the second array area.

6. The method of claim 4, wherein reducing floating gate coupling comprises:
   isolating the first array area from the second array area with a gap.

7. The method of claim 4, wherein reducing floating gate coupling comprises:
   providing a non-connected bitline at the boundary between the first array area and the second array area; and
   isolating the first array area from the second array area with a gap.

8. The method of claim 4, wherein reducing floating gate coupling comprises placing an isolation trench between the first portion and the second portion.

9. The method of claim 4, wherein reducing floating gate coupling comprises:
   providing a gap between bitlines at a boundary between the first portion and the second portion.

10. A method of programming a NAND memory device, comprising:
    programming a first portion of the device comprising a plurality of adjacent bitlines; and
    programming a second portion of the device comprising a second plurality of adjacent bitlines;
    wherein programming the first portion comprises programming all even bitlines of the memory, and wherein programming the second portion comprises programming all odd bitlines of the memory.

11. A method of programming a NAND memory device, comprising:
    programming a first portion of the device comprising a plurality of adjacent bitlines;
    programming a second portion of the device comprising a second plurality of adjacent bitlines; and
    increasing isolation between the first portion and the second portion.

12. The method of claim 10, and further comprising:
    isolating the first portion from the second portion with an isolation trench.

13. A method of reducing floating gate coupling in a NAND memory having cells programmed on the same word line, comprising:
    arranging all even bitlines of each array of the memory in a first portion of the memory;
    arranging all odd bitlines of each array of the memory in a second portion of the memory separate from the first portion of the array;
    programming all even bitlines simultaneously; and
    programming all odd bitlines simultaneously.

14. The method of claim 13, and further comprising:
placing a non-connected bitline between the first portion of each array and the second portion of each array.

15. The method of claim 13, and further comprising:
increasing isolation between the first portion of the memory and the second portion of the memory.

16. The method of claim 15, wherein increasing isolation further comprises:
placing an isolation trench between the first portion and the second portion.

17. The method of claim 15, wherein increasing isolation further comprises:
increasing a gap between bitlines at a boundary between the first portion and the second portion.

18. The method of claim 15, wherein increasing isolation further comprises: providing a gap between the first portion and the second portion.

* * * * *